(12) United States Patent
Masuko

(10) Patent No.: US 9,966,311 B2
(45) Date of Patent: May 8, 2018

(54) SEMICONDUCTOR DEVICE MANUFACTURING METHOD

(71) Applicant: Kabushiki Kaisha Toshiba, Minato-ku, Tokyo (JP)

(72) Inventor: Shingo Masuko, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 15/067,396

(22) Filed: Mar. 11, 2016

(65) Prior Publication Data

US 2017/0069535 A1    Mar. 9, 2017

(30) Foreign Application Priority Data

Sep. 7, 2015  (JP) ................. 2015-175951

(51) Int. Cl.
| | |
|---|---|
| *H01L 21/71* | (2006.01) |
| *B23K 26/00* | (2014.01) |
| *H01L 21/78* | (2006.01) |
| *H01L 21/683* | (2006.01) |
| *H01L 29/20* | (2006.01) |
| *H01L 29/66* | (2006.01) |

(52) U.S. Cl.
CPC .......... *H01L 21/78* (2013.01); *H01L 21/6835* (2013.01); *H01L 21/6836* (2013.01); *H01L 29/2003* (2013.01); *H01L 29/66462* (2013.01); *H01L 2221/6834* (2013.01); *H01L 2221/68327* (2013.01)

(58) Field of Classification Search
CPC .......... H01L 21/67092; H01L 21/6836; H01L 21/71; B23K 26/00
See application file for complete search history.

(56) References Cited

U.S. PATENT DOCUMENTS

| | | | |
|---|---|---|---|
| 5,338,967 A * | 8/1994 | Kosaki ................ | H01L 23/3735 257/620 |
| 2005/0186760 A1 * | 8/2005 | Hashimura ............ | B23K 26/18 438/460 |

(Continued)

FOREIGN PATENT DOCUMENTS

| | | |
|---|---|---|
| JP | 2006-261476 A | 9/2006 |
| JP | 2012-156250 A | 8/2012 |

(Continued)

*Primary Examiner* — Mohammad Choudhry
(74) *Attorney, Agent, or Firm* — White & Case LLP

(57) ABSTRACT

A semiconductor device manufacturing method according to an embodiment including partially forming a first groove on a nitride semiconductor layer provided on a first plane of a substrate having first and second planes by etching so that the substrate is exposed, forming a second groove on the substrate exposed inside the first groove so that a portion of the substrate remains, removing the substrate from the second plane side so that the second groove is not exposed, thinning the substrate, forming a metal film on the second plane side of the substrate, removing the metal film in a portion where the second groove is formed, and forming a third groove on the substrate in the portion where the second groove is formed so that the second groove is exposed from the second plane side.

20 Claims, 8 Drawing Sheets

(56) References Cited

U.S. PATENT DOCUMENTS

| | | | |
|---|---|---|---|
| 2007/0190691 A1* | 8/2007 | Humpston | B81C 1/00269 438/113 |
| 2010/0175177 A1 | 7/2010 | Lee et al. | |
| 2010/0237451 A1 | 9/2010 | Murakoshi | |

FOREIGN PATENT DOCUMENTS

| | | |
|---|---|---|
| JP | 2014-175566 A | 9/2014 |
| TW | 201103134 A | 1/2011 |
| TW | 201125807 A | 8/2011 |

* cited by examiner

US 9,966,311 B2

SEMICONDUCTOR DEVICE MANUFACTURING METHOD

CROSS-REFERENCE TO RELATED APPLICATION

This application is based upon and claims the benefit of priority from Japanese Patent Application No. 2015-175951, filed on Sep. 7, 2015, the entire contents of which are incorporated herein by reference.

FIELD

Embodiments described herein relate generally to a semiconductor device manufacturing method.

BACKGROUND

A plurality of semiconductor elements formed on a semiconductor substrate such as a wafer is divided into a plurality of semiconductor chips by dicing along dicing regions provided in the semiconductor substrate. In some cases, a semiconductor substrate is, for example, a composite substrate configured with a plurality of different materials like a GaN-based semiconductor layer/silicon substrate/metal film. At the time of dicing the composite substrate, since physical properties of the materials are different, chipping, cracking, and the like of the substrate is likely to occur. Therefore, it is difficult to improve dicing yield of the semiconductor device.

DETAILED DESCRIPTION

Figure 1:
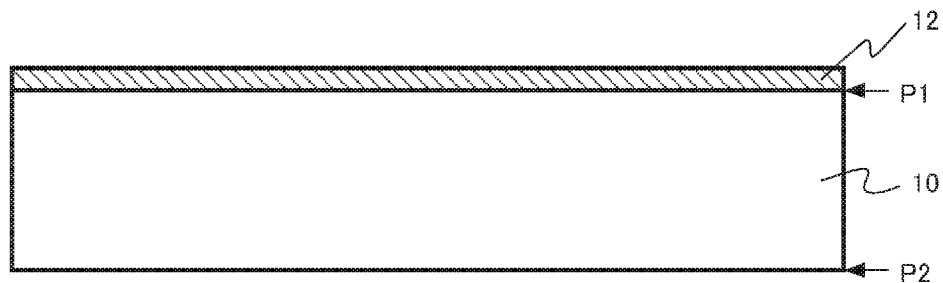
FIG. 1 is a schematic process cross-sectional diagram illustrating a semiconductor device manufacturing method according to a first embodiment.

A semiconductor device manufacturing method according to an embodiment includes forming a first groove partially on a nitride semiconductor layer, the nitride semiconductor layer provided on a first plane of a substrate, the substrate having the first plane and a second plane, the first groove being formed by etching so that the substrate is exposed, forming a second groove on the substrate exposed inside the first groove, the second groove being formed so that a portion of the substrate remains, thinning the substrate by removing a part of the substrate from the second plane side, the part of the substrate being removed so that the second groove is not exposed, forming a metal film on the second plane side of the substrate, removing the metal film in a portion where the second groove is formed, and forming a third groove on the substrate from the second plane side, the third groove being formed in the portion where the second groove is formed, the third groove being formed so that the second groove is exposed.

Hereinafter, embodiments of the present invention will be described with reference to the drawings. In addition, in the description hereinafter, the same or similar components are denoted by the same reference numerals, and the components or the like described once are appropriately omitted in description.

In addition, in this specification, a "GaN-based semiconductor" is a generic name of GaN (gallium nitride), AlN (gallium aluminum), InN (gallium indium), and a semiconductor having such an intermediate composition.

First Embodiment

A semiconductor device manufacturing method according to an embodiment includes partially forming a first groove on a nitride semiconductor layer provided on a first plane of a substrate having first and second planes by etching so that the substrate is exposed, forming a second groove on the substrate exposed within the first groove so that a portion of the substrate remains, removing the substrate from the second plane side so that the second groove is not exposed, thinning the substrate, forming a metal film on the second plane side of the substrate, removing the metal film in a portion where the second groove is formed, and forming a third groove on the substrate in the portion where the second groove is formed so that the second groove is exposed from the second plane side.

FIGS. 1 to 10 are schematic process cross-sectional diagrams illustrating the semiconductor device manufacturing method according to the embodiment.

First, a semiconductor wafer where a GaN-based semiconductor layer (nitride semiconductor layer) 12 is installed on a silicon substrate (substrate) 10 is prepared (FIG. 1). The silicon substrate 10 has a first plane P1 and a second plane P2.

A thickness of the silicon substrate 10 is, for example, 1 mm or more and 2 mm or less, and a thickness of the GaN-based semiconductor layer 12 is, for example, 5 µm or more and 10 µm or less.

The GaN-based semiconductor layer 12 is provided on the first plane P1 of the silicon substrate 10. The GaN-based semiconductor layer 12 is formed on the silicon substrate 10 by epitaxial growth. The GaN-based semiconductor layer 12 has, for example, a stacked structure of a GaN layer and an AlGaN layer.

Next, a plurality of semiconductor elements is formed on the GaN-based semiconductor layer 12. The semiconductor element is, for example, a high electron mobility transistor (HEMT).

Figure 2:
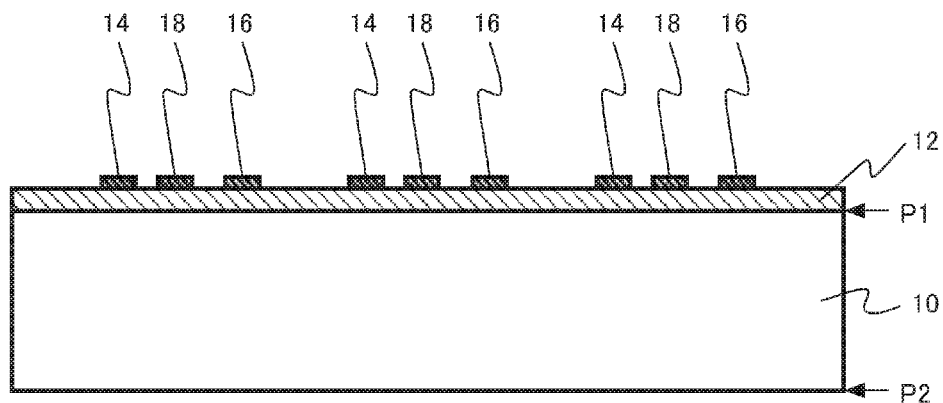
FIG. 2 is a schematic process cross-sectional diagram illustrating the semiconductor device manufacturing method according to the first embodiment.

For example, source electrodes 14, drain electrodes 16, and gate electrodes 18 of the HEMTs are formed on the surface of the GaN-based semiconductor layer 12 (FIG. 2). For example, a protective film (not shown) is formed on the source electrodes 14, the drain electrodes 16, and the gate electrodes 18. The protective film is, for example, a silicon oxide film.

Figure 3:
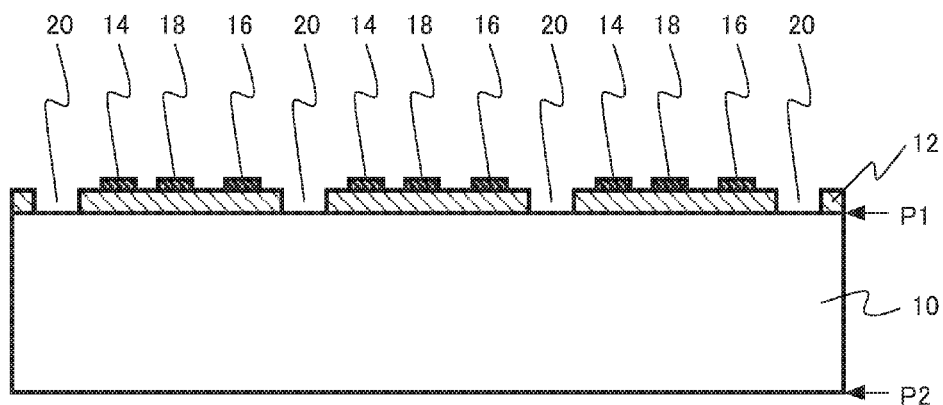
FIG. 3 is a schematic process cross-sectional diagram illustrating the semiconductor device manufacturing method according to the first embodiment.

Next, first grooves 20 are partially formed on the surface of the GaN-based semiconductor layer 12 by etching (FIG. 3). The first grooves 20 are formed so that the silicon substrate 10 is exposed.

The first grooves 20 are formed along dicing regions installed on the semiconductor wafer. Herein, the dicing regions are prearranged regions having a predetermined width for dividing the plurality of semiconductor elements into a plurality of semiconductor chips by dicing. The dicing regions are installed on the surface side of the GaN-based semiconductor layer 12. A pattern of the semiconductor elements is not formed on the dicing regions. The dicing regions are installed, for example, on the surface side of the GaN-based semiconductor layer 12 in a lattice shape so as to separate the semiconductor elements.

The etching of the first grooves 20 is performed, for example, by reactive ion etching (RIE). The etching of the first grooves 20 is performed, for example, by using resist (not shown) as a mask. The etching of the first grooves 20 may also be performed by dry etching or wet etching.

Figure 4:
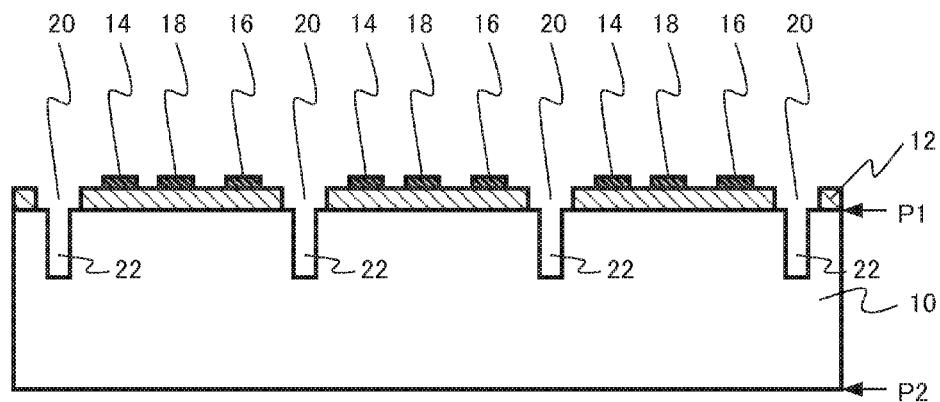
FIG. 4 is a schematic process cross-sectional diagram illustrating the semiconductor device manufacturing method according to the first embodiment.

Next, second grooves 22 are formed on the silicon substrate 10 exposed inside the first grooves 20 (FIG. 4). The second grooves 22 are formed so that the silicon substrate 10 remains. In other words, the second grooves 22 are formed so as not to penetrate the silicon substrate 10.

The second grooves 22 are formed, for example, by blade dicing. The second grooves 22 may also be formed, for example, by scribing.

The width of the second groove 22 is preferably smaller than that of the first groove 20. Therefore, it is prevented that occurrence of misalignment of the second grooves 22 with respect to the first groove 20 leads to overlap of the second grooves 22 with ends of the first grooves 20. If the second grooves 22 overlap with the ends of the first grooves 20, there may be a problem in that chipping may occur in the GaN-based semiconductor layer 12.

Figure 5:
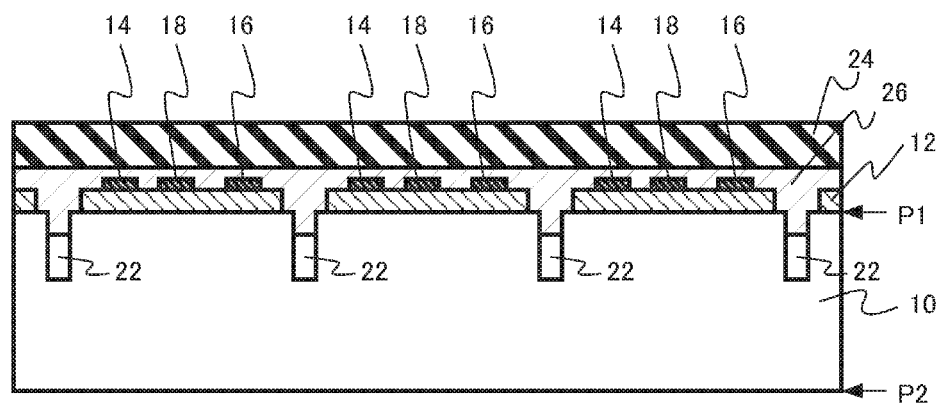
FIG. 5 is a schematic process cross-sectional diagram illustrating the semiconductor device manufacturing method according to the first embodiment.

Next, a support member 24 is bonded on the GaN-based semiconductor layer 12 (FIG. 5). The support member 24 is adhered to the GaN-based semiconductor layer 12, for example, by using an adhesive layer 26.

The support member 24 has a function of reinforcing the wafer when the wafer is shaved to be thin. The support member 24 is, for example, a glass substrate.

Figure 6:
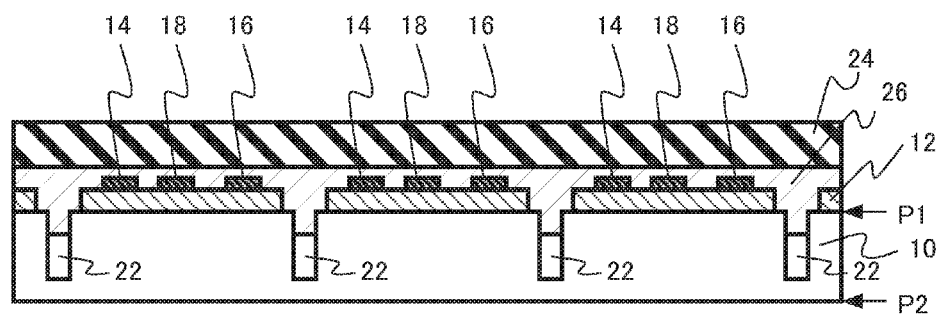
FIG. 6 is a schematic process cross-sectional diagram illustrating the semiconductor device manufacturing method according to the first embodiment.

Next, the silicon substrate 10 is removed from the second plane P2 side of the silicon substrate 10 to be thinned (FIG. 6). The silicon substrate 10 is removed so that the second grooves 22 are not exposed. The thickness of the silicon substrate 10 is reduced down to, for example, 100 µm or more and 200 µm or less.

The removal of the silicon substrate 10 is so-called back grinding. The removal of the silicon substrate 10 is performed, for example, by grinding using a diamond wheel.

Figure 7:
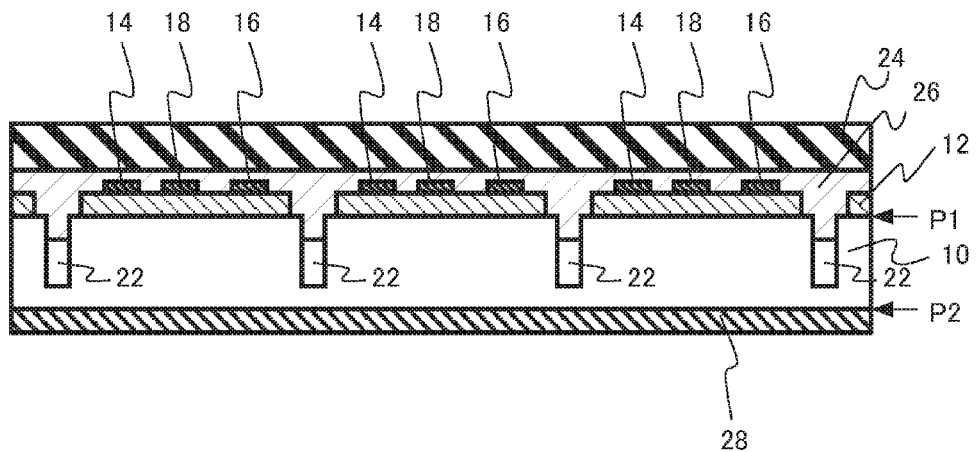
FIG. 7 is a schematic process cross-sectional diagram illustrating the semiconductor device manufacturing method according to the first embodiment.

Next, a metal film 28 is formed on the second plane P2 side of the silicon substrate 10 (FIG. 7). The metal film 28 is formed, for example, by sputtering.

The metal film 28 has a function of, for example, improving a heat dissipation property of the semiconductor chip. In addition, the metal film has a function, for example, as a reaction layer for connecting the semiconductor chip and a metal bed at the time of packaging of the semiconductor chip. The metal film 28 has a function, for example, as a backside electrode.

The metal film 28 is, for example, a film containing nickel (Ni). The metal film 28 may be a stacked film of different types of metals.

Figure 8:
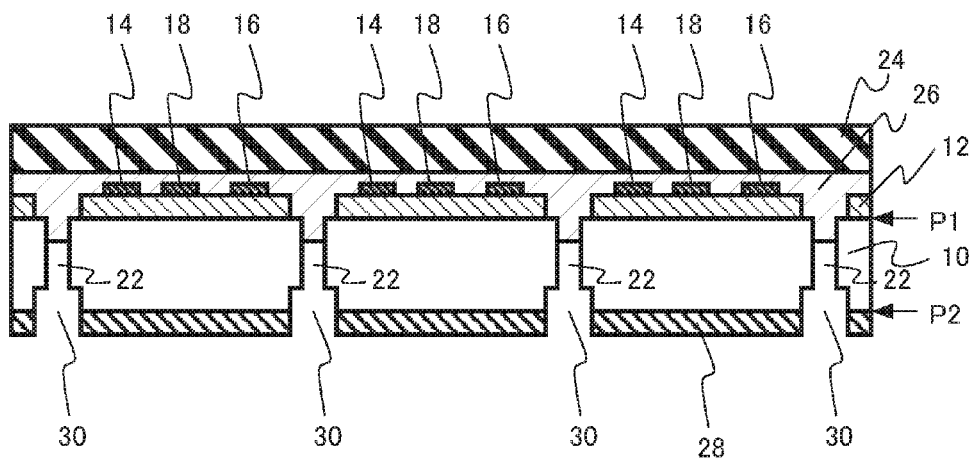
FIG. 8 is a schematic process cross-sectional diagram illustrating the semiconductor device manufacturing method according to the first embodiment.

Next, the metal film 28 in the portions where the second grooves 22 are formed is removed. Next, third grooves 30 are formed on the silicon substrate 10 in the portions where the second grooves 22 are formed. The formation of the third grooves 30 is performed so that the second grooves 22 are exposed from the second plane P2 side of the silicon substrate 10 (FIG. 8).

The removal of the metal film 28 and the formation of the third grooves 30 may be simultaneously performed by the same process. The removal of the metal film 28 and the formation of the third grooves 30 are simultaneously performed, for example, by blade dicing.

The removal of the metal film 28 and the formation of the third grooves 30 may be performed independently. For example, after the metal film 28 is removed by etching or the like, the formation of the third grooves 30 may be performed by dicing or breaking.

The width of the third groove 30 is preferably larger than that of the second groove 22. Although misalignment occurs, the overlap of the third groove 30 with the second groove 22 is ensured. In addition, as described later, an overhang (protrusion) can be formed in the side surface of the semiconductor chip after the dicing.

Figure 9:
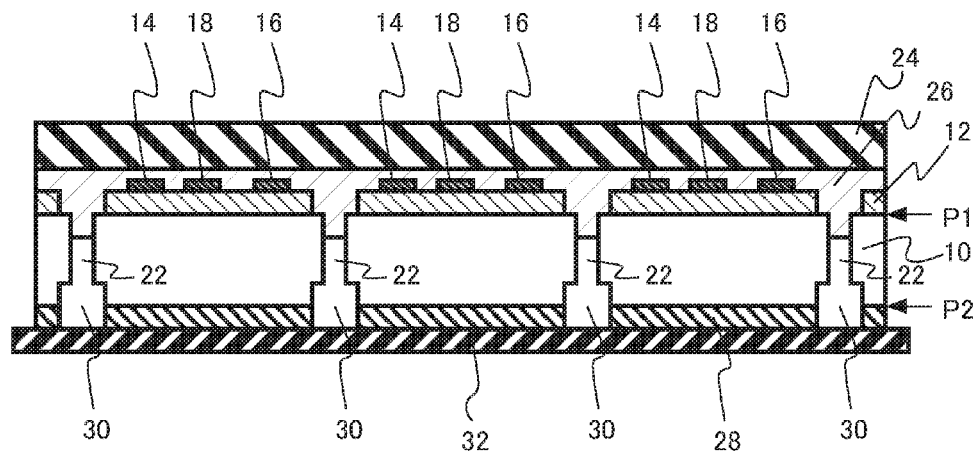
FIG. 9 is a schematic process cross-sectional diagram illustrating the semiconductor device manufacturing method according to the first embodiment.

Next, a resin sheet 32 is bonded on the second plane P2 side of the silicon substrate 10 (FIG. 9). The resin sheet 32 is, for example, a dicing tape. The resin sheet 32 is fixed to a metal frame, for example, for handling. The resin sheet 32 is adhered to the metal film 28.

Figure 10:
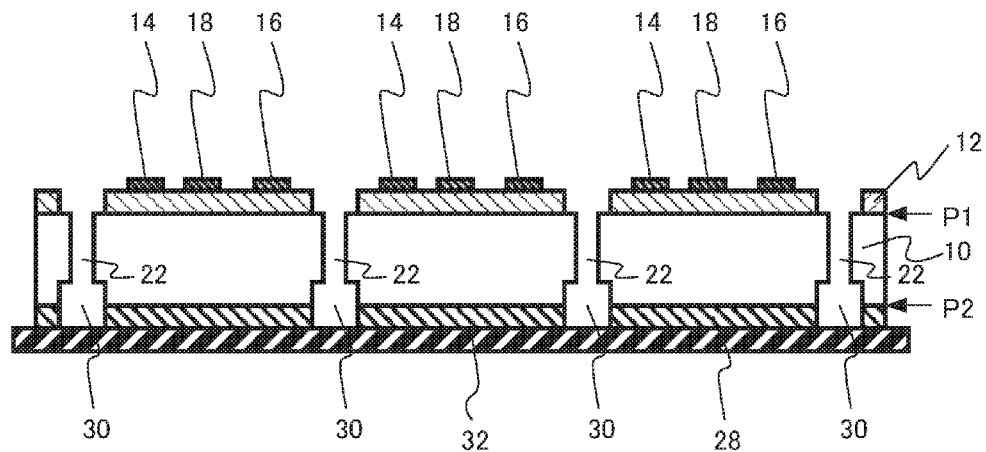
FIG. 10 is a schematic process cross-sectional diagram illustrating the semiconductor device manufacturing method according to the first embodiment.

Next, the support member 24 is removed from the wafer (FIG. 10). After that, the resin sheet 32 is removed from the metal film 28, so that a plurality of divided semiconductor chips (semiconductor devices) can be obtained.

Hereinafter, functions and effects of the semiconductor device manufacturing method according to the embodiment will be described.

In case of dicing the semiconductor wafer, in some cases, like this embodiment, the semiconductor wafer is a composite substrate configured with a plurality of different materials such as GaN-based semiconductor layer/silicon substrate/metal film. Since the physical properties of the materials are different, it is difficult to improve a dicing yield of the dicing of the composite substrate.

For example, the GaN-based semiconductor is hard and brittle in comparison with silicon. In addition, for example, the metal film is soft and ductile in comparison with silicon. For this reason, if the dicing is simultaneously performed on all the materials with the same condition, for example, chipping or cracking of the semiconductor wafer easily occurs, so that the yield is reduced. In addition, for example, burr of the metal film is generated, so that the yield is reduced.

In addition, before the dicing of the semiconductor wafer, for lower profile of the semiconductor chip, the semiconductor wafer is thinned by back grinding. If the semiconductor wafer is thinned, a mechanical strength is reduced.

As described above, the GaN-based semiconductor is hard and brittle. In addition, by stacking the silicon substrate and the GaN-based semiconductor which have different physical properties, stress is generated. For this reason, the semiconductor wafer where the GaN-based semiconductor and the silicon substrate are stacked has particularly a low mechanical strength. Therefore, by handling after the back grinding of the semiconductor wafer, the cracking of the semiconductor wafer more easily occurs.

In the semiconductor device manufacturing method according to the embodiment, the GaN-based semiconductor layer 12 is removed at the time of forming the first grooves 20, and the silicon substrate 10 is removed at the time of forming the second grooves 22. The metal film 28 may be independently removed by a process different from the processes of the formation of the first grooves 20 and the second grooves 22. The GaN-based semiconductor layer 12, the silicon substrate 10, and the metal film 28 are removed in the conditions optimized for the respective materials. Therefore, the chipping or the cracking of the semiconductor wafer is suppressed, so that a production yield of the semiconductor device is improved.

In addition, in the semiconductor device manufacturing method according to the embodiment, after the semiconductor wafer is thinned by the back grinding, until the semiconductor wafer is divided into the semiconductor chips, the support member 24 is not removed. Therefore, a process of exerting a large external force on the thinned semiconductor wafer, for example, a process of re-covering with a dicing tape is excluded in performing. Therefore, the cracking of the semiconductor wafer is suppressed, and a production yield of the semiconductor device is improved.

In addition, in the semiconductor device manufacturing method according to the embodiment, at the time of the back grinding of the semiconductor wafer, the silicon substrate 10 remains so that the second grooves 22 are not exposed. Therefore, at the time of forming the metal film 28, the metal film 28 is prevented from being formed inside the second grooves 22. Accordingly, occurrence of the short-circuit failure of the semiconductor chip caused by the formation of the metal film 28 on the side surface of the semiconductor chip is suppressed.

When the semiconductor wafer is thinned by back grinding, the thickness of the silicon substrate 10 in the portions where the second grooves 22 are formed is preferably set to be 20 µm or more and 50 µm or less. If the thickness exceeds 50 µm, when the removal of the metal film 28 and the formation of the third grooves 30 are simultaneously performed, it is difficult to perform the formation of the third grooves 30. In addition, if the thickness is smaller than 20 µm, there may be a problem in that the effect of suppressing creeping of a packaging material described later cannot be achieved.

Figure 11:
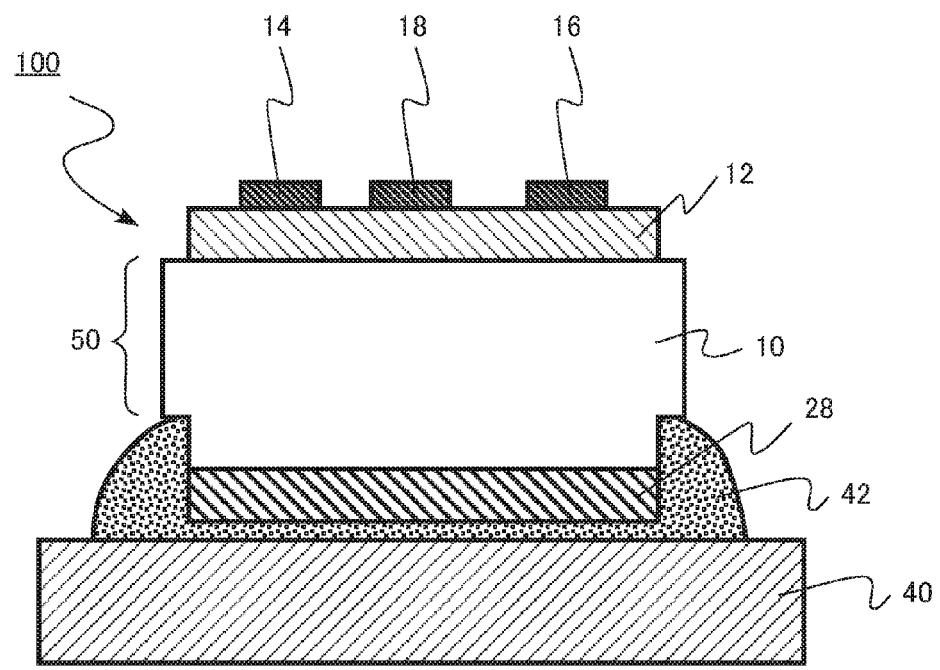
FIG. 11 is an explanation diagram illustrating functions and effects of the semiconductor device manufacturing method according to the first embodiment.

FIG. 11 is an explanation diagram illustrating functions and effects of the semiconductor device manufacturing method according to the embodiment.

FIG. 11 illustrates a state where the semiconductor chip 100 manufactured by the semiconductor device manufacturing method according to the embodiment is packaged. The metal film 28 side of the semiconductor chip 100 is adhered on a metal bed 40.

The semiconductor chip 100 and the metal bed 40 are adhered to each other by a packaging material 42. The packaging material 42 is, for example, is a solder.

When the semiconductor chip 100 is packaged, there may be a problem in that the packaging material 42 creeps up the side surface of the semiconductor chip 100 and, thus, short-circuit failure of the semiconductor chip 100 occurs. In the manufacturing method according to the embodiment, the width of the third groove 30 is set to be larger than that of the second groove 22. Therefore, an overhang (protrusion) 50 protruding in the lateral direction is formed in the side surface of the semiconductor chip 100.

The overhang 50 is formed, so that the packaging material 42 is prevented from creeping up the side surface of the semiconductor chip 100 as illustrated in FIG. 11. Therefore, the short-circuit failure of the semiconductor chip 100 is suppressed.

From the point of view of effectively suppressing creeping of a packaging material, a distance from the interface between the silicon substrate 10 and the metal film 28 to the overhang 50 is preferably 20 µm or more. When the semiconductor wafer is thinned by back grinding, the thickness of the silicon substrate 10 in the portions where the second grooves 22 are formed is set to be 20 µm or more, so that the distance from the interface between the silicon substrate 10 and the metal film 28 to the overhang 50 can be configured to be 20 µm or more.

Heretofore, according to the semiconductor device manufacturing method according to the embodiment, the dicing yield of the substrate having a plurality of materials can be improved. In addition, a defect at the time of packaging the semiconductor chip can be reduced.

Second Embodiment

A semiconductor device manufacturing method according to the embodiment is the same as that of the first embodiment except that the second groove is formed by dry etching. Therefore, redundant contents of the first embodiment are omitted in description.

FIGS. 12 to 19 are schematic process cross-sectional diagrams illustrating the semiconductor device manufacturing method according to the embodiment.

The processes performed until the plurality of semiconductor elements are formed on the GaN-based semiconductor layer 12 are the same as those of the first embodiment.

Figure 12:
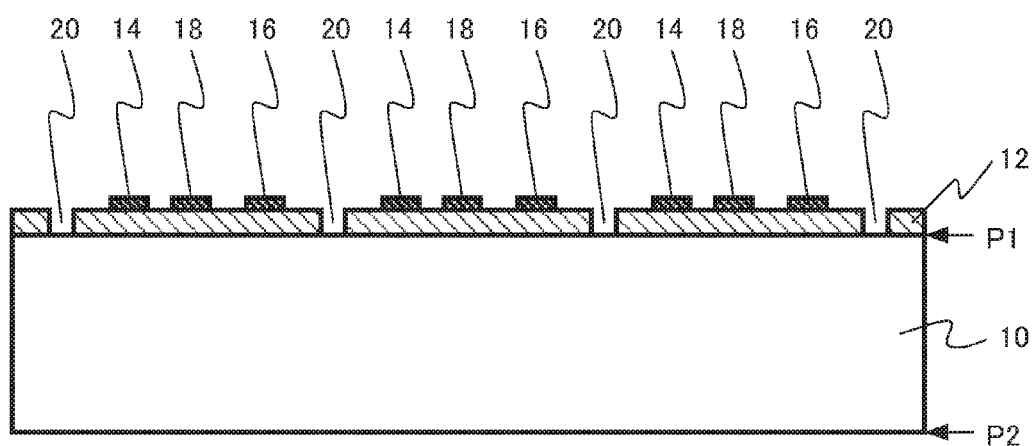
FIG. 12 is a schematic process cross-sectional diagram illustrating a semiconductor device manufacturing method according to a second embodiment.

Next, first grooves 20 are partially formed on a surface of a GaN-based semiconductor layer 12 by etching (FIG. 12). The first grooves 20 are formed so that a silicon substrate 10 is exposed.

The etching of the first grooves 20 is performed by dry etching. The dry etching is, for example, RIE. The etching of the first groove 20 is performed, for example, by using patterned resist (not shown) as a mask. The etching of the first groove 20 may be performed, for example, by using a patterned protective film (not shown) as a mask.

Figure 13:
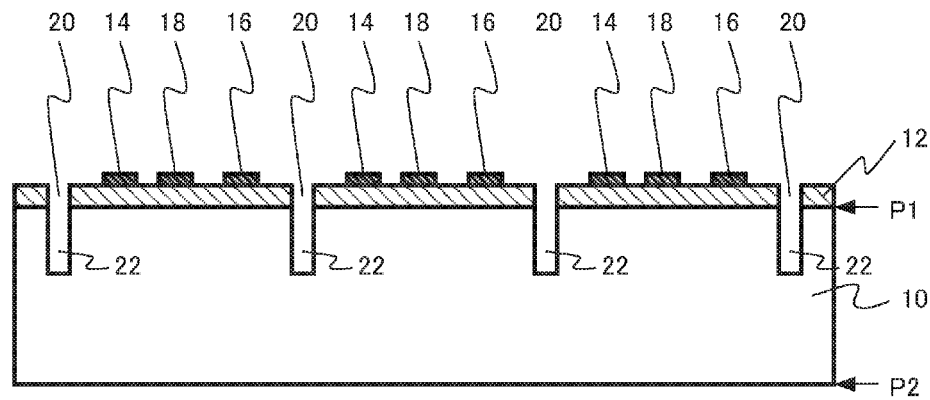
FIG. 13 is a schematic process cross-sectional diagram illustrating the semiconductor device manufacturing method according to the second embodiment.

Next, second grooves 22 are formed on the silicon substrate 10 exposed inside the first grooves 20 (FIG. 13). The second grooves 22 are formed so that the silicon substrate 10 remains.

The second grooves 22 are formed by dry etching. The dry etching is, for example, plasma etching of repeating anisotropic etching such as deep RIE.

In the formation of the second grooves 22, a resist pattern or a protective film pattern formed at the time of forming the first grooves 20 is used as a mask. Therefore, the second grooves 22 are continuously processed by the same apparatus with respect to the pattern for the first grooves 20, or the first grooves 20 and the second grooves 22 are processed by different apparatuses, so that the second grooves can be formed in a self-aligned manner.

Figure 14:
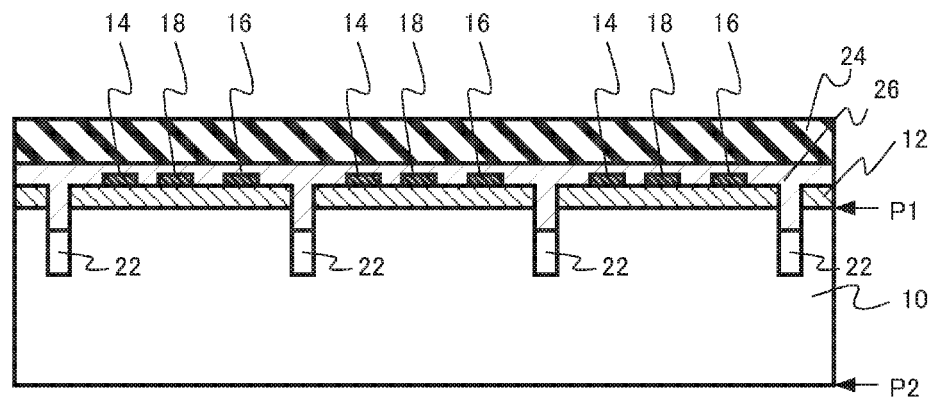
FIG. 14 is a schematic process cross-sectional diagram illustrating the semiconductor device manufacturing method according to the second embodiment.

Next, a support member 24 is bonded on the GaN-based semiconductor layer 12 (FIG. 14).

Figure 15:
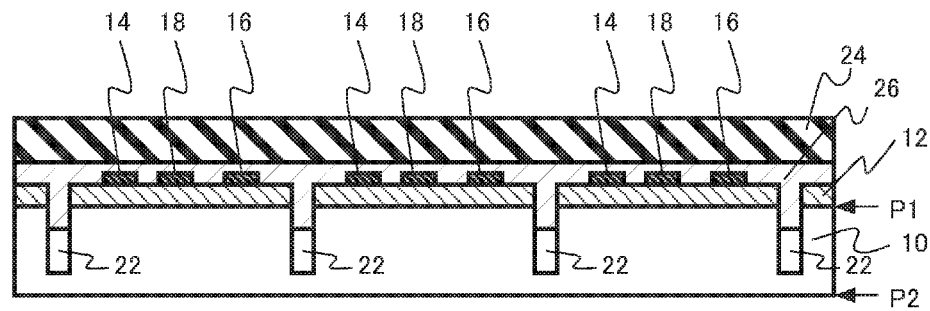
FIG. 15 is a schematic process cross-sectional diagram illustrating the semiconductor device manufacturing method according to the second embodiment.

Next, the silicon substrate 10 is removed from a second plane P2 side of the silicon substrate 10 to be thinned (FIG. 15).

Figure 16:
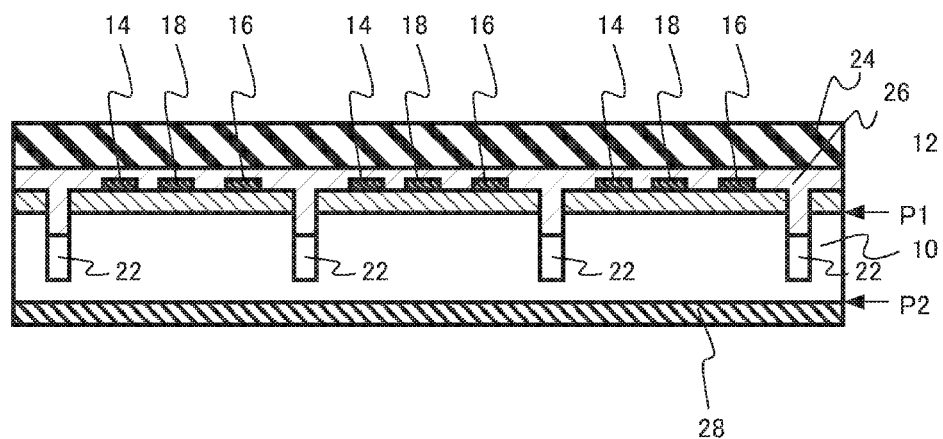
FIG. 16 is a schematic process cross-sectional diagram illustrating the semiconductor device manufacturing method according to the second embodiment.

Next, a metal film 28 is formed on the second plane P2 side of the silicon substrate 10 (FIG. 16).

Figure 17:
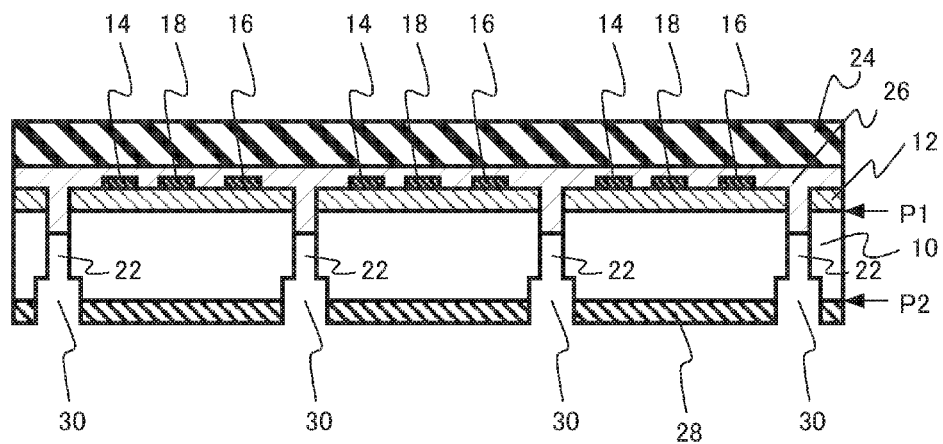
FIG. 17 is a schematic process cross-sectional diagram illustrating the semiconductor device manufacturing method according to the second embodiment.

Next, the metal film 28 in the portions where the second grooves 22 are formed is removed. Next, third grooves 30 are formed on the silicon substrate 10 in the portions where the second grooves 22 are formed. The formation of the third grooves 30 is performed so that the second grooves 22 are exposed from the second plane P2 side (FIG. 17).

Figure 18:
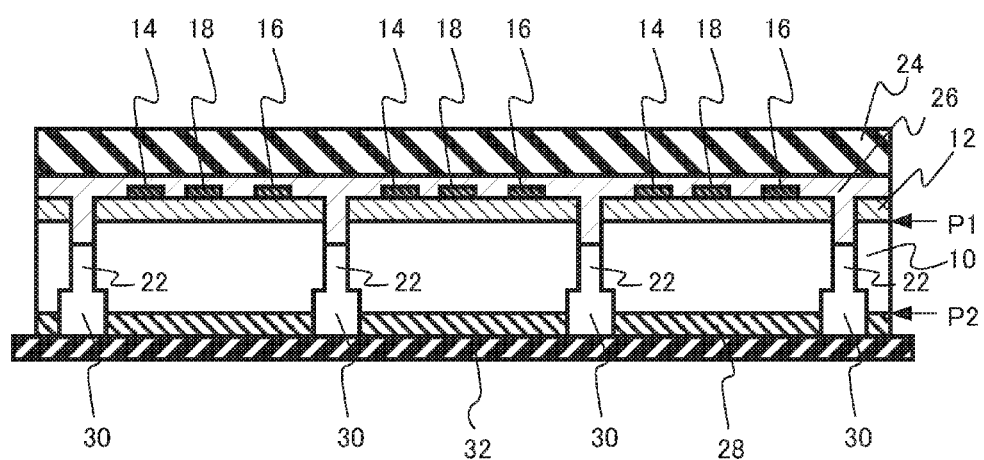
FIG. 18 is a schematic process cross-sectional diagram illustrating the semiconductor device manufacturing method according to the second embodiment.

Next, a resin sheet 32 is bonded on the second plane P2 side of the silicon substrate 10 (FIG. 18).

Figure 19:
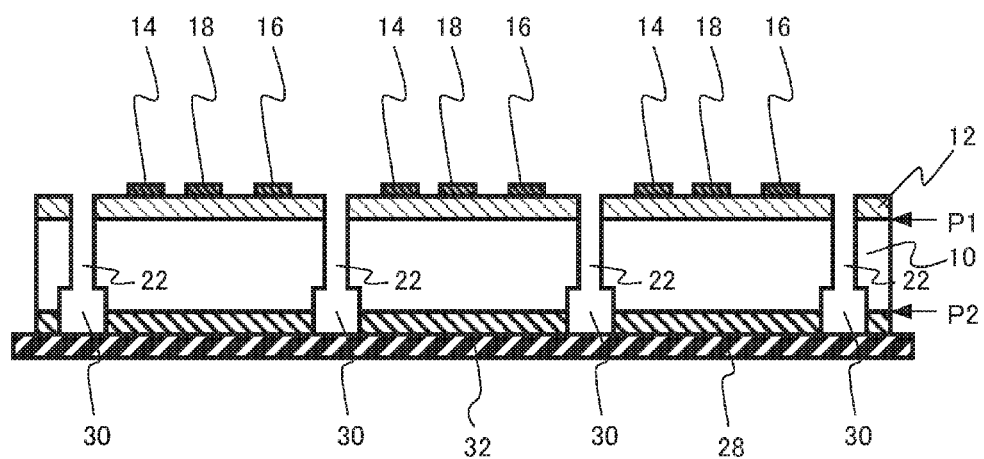
FIG. 19 is a schematic process cross-sectional diagram illustrating the semiconductor device manufacturing method according to the second embodiment.

Next, the support member 24 is removed from the water (FIG. 19). After that, the resin sheet 32 is removed from the metal film 28, so that a plurality of divided semiconductor chips (semiconductor devices) can be obtained.

In the semiconductor device manufacturing method according to the embodiment, the formation of the second grooves 22 is performed by dry etching. Therefore, for example, in comparison with the case of performing the formation of the second grooves 22 by a physical method such as blade dicing or scribing, the width of the second groove 22 can be reduced.

In the semiconductor device manufacturing method according to the embodiment, the formation of the second grooves 22 is continuously processed by the same apparatus with respect to the first grooves 20, or the first grooves 20 and the second grooves 22 are processed by different apparatuses, so that the second grooves can be formed in a self-aligned manner. Therefore, a bonding margin for forming the second grooves 22 needs not to be provided to the width of the first grooves 20. Accordingly, the width of the first groove 20 can be reduced. Therefore, the width of the dicing line is set to be small, so that the size of the semiconductor chip can be reduced.

Heretofore, according to the semiconductor device manufacturing method according to the embodiment, similarly to the first embodiment, a dicing yield of the substrate having a plurality of materials can be improved. In addition, similarly to the first embodiment, defects at the time of packaging the semiconductor chip can be reduced. Furthermore, the width of the dicing line is set to be small, so that the size of the semiconductor chip can be reduced.

In addition, although a case where the semiconductor elements are HEMTs is described as an example in the first and second embodiments, the semiconductor elements are not limited to the HEMTs. Any semiconductor element including a metal film on the back surface such as a vertical MOSFET, or other semiconductor elements may be employed.

In addition, although the example where the silicon substrate is used as a substrate is described in the first and second embodiments, any substrate other than the silicon substrate, for example, a sapphire substrate, a silicon carbide (SiC) substrate, or other substrates may be employed.

While certain embodiments have been described, these embodiments have been presented by way of example only, and are not intended to limit the scope of the inventions. Indeed, a semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:

forming a first groove partially on a nitride semiconductor layer, the nitride semiconductor layer provided on a first plane of a substrate, the substrate having the first plane and a second plane, the first groove being formed by etching so that the substrate is exposed;

forming a second groove on the substrate exposed inside the first groove after forming the first grove, the second groove being formed so that a portion of the substrate remains;

thinning the substrate by removing a part of the substrate from the second plane side after forming the second grove, the part of the substrate being removed so that the second groove is not exposed;

forming a metal film on the second plane side of the substrate after thinning the substrate;

removing the metal film in a portion where the second groove is formed; and forming a third groove on the substrate from the second plane side after removing the metal film, the third groove being formed in the portion where the second groove is formed, the third groove being formed so that the second groove is exposed.

2. The semiconductor device manufacturing method according to claim 1, further comprising bonding a support member on the nitride semiconductor layer, before the thinning the substrate.

3. The semiconductor device manufacturing method according to claim 1, wherein the second groove is formed by blade dicing.

4. The semiconductor device manufacturing method according to claim 1, wherein the second groove is formed by dry etching.

5. The semiconductor device manufacturing method according to claim 1, wherein the third groove is formed by blade dicing.

6. The semiconductor device manufacturing method according to claim 1, wherein the removing of the metal film and the forming of the third groove are simultaneously performed by blade dicing.

7. The semiconductor device manufacturing method according to claim 1, wherein a width of the third groove is larger than a width of the second groove.

8. The semiconductor device manufacturing method according to claim 1, wherein, in the thinning the substrate, a thickness of the substrate after the thinning in the portion where the second groove is formed is set to be 20 µm or more and 50 µm or less.

9. The semiconductor device manufacturing method according to claim 1, wherein the substrate is a silicon substrate.

10. The semiconductor device manufacturing method according to claim 1, wherein the nitride semiconductor layer is a GaN-based semiconductor layer.

11. The semiconductor device manufacturing method according to claim 9, wherein a thickness of the silicon substrate is 1 mm or more and 2 mm or less.

12. The semiconductor device manufacturing method according to claim 10, wherein a thickness of the GaN-based semiconductor layer is 5 µm or more and 10 µm or less.

13. The semiconductor device manufacturing method according to claim 1, wherein the metal film is a film containing nickel.

14. The semiconductor device manufacturing method according to claim 10, wherein the GaN-based semiconductor layer includes a GaN layer and an AlGaN layer.

15. The semiconductor device manufacturing method according to claim 1, wherein, in the thinning the substrate, a thickness of the substrate after the thinning is set to be 100 µm or more and 200 µm or less.

16. The semiconductor device manufacturing method according to claim 1, wherein, in the thinning of the substrate, grinding using a diamond wheel is performed.

17. The semiconductor device manufacturing method according to claim 2, wherein the support member is a glass substrate.

18. The semiconductor device manufacturing method according to claim 1, wherein the first groove is formed by dry etching.

19. The semiconductor device manufacturing method according to claim 1, further comprising bonding a support member on the nitride semiconductor layer, before the thinning the substrate, wherein the first groove is formed by dry etching, the second groove is formed by blade dicing, and the removing of the metal film and the forming of the third groove are simultaneously performed by blade dicing, and a width of the third groove is larger than a width of the second groove.

20. The semiconductor device manufacturing method according to claim 1, further comprising bonding a support member on the nitride semiconductor layer, before the thinning the substrate, wherein the first groove is formed by dry etching, the second groove is formed by dry etching, the removing of the metal film and the forming of the third groove are simultaneously performed by blade dicing, and a width of the third groove is larger than a width of the second groove.

* * * * *